United States Patent [19]
Berlekamp

[11] Patent Number: 4,821,268
[45] Date of Patent: Apr. 11, 1989

[54] SOFT DECISION REED-SOLOMON DECODER
[75] Inventor: Elwyn R. Berlekamp, Berkeley, Calif.
[73] Assignee: Cyclotomics, Inc., Berkeley, Calif.
[21] Appl. No.: 113,579
[22] Filed: Oct. 26, 1987
[51] Int. Cl.[4] .............................................. G06F 11/10
[52] U.S. Cl. .................................................. 371/37
[58] Field of Search .................... 371/37, 38, 39, 40, 371/43

[56] References Cited
U.S. PATENT DOCUMENTS

| | | | |
|---|---|---|---|
| 4,322,848 | 3/1982 | Snyder | 371/37 X |
| 4,328,582 | 5/1982 | Battail | 371/37 |
| 4,754,458 | 6/1988 | Dornstetter | 371/37 X |
| 4,763,331 | 8/1988 | Matsumoto | 371/37 |

Primary Examiner—Jerry Smith
Assistant Examiner—Robert W. Beausoliel
Attorney, Agent, or Firm—Robert M. Wallace

[57] ABSTRACT

In a Reed-Solomon Decoder, each byte of a received codeword is matched to the closest resembling one of a set of allowed symbols and assigned a certain reliability, reflecting the degree of resemblance. The symbols thus matched are arranged in descending order to reliability to form a virtual codeword, the first K symbols being virtual message bytes and the remaining r symbols being virtual check bytes. The virtual codeword is then decoded using an algorithm which produces a series of iterative approximations to the transmitted codeword. The approximation most closely resembling the received codeword is selected as the corrected codeword.

14 Claims, 6 Drawing Sheets

FIG. 4
VIRTUAL MESSAGE RS ENCODER

DEFINITIONS:

$X_i$ = RECEIVED VIRTUAL MESSAGE BYTE AT VIRTUAL MESSAGE LOCATION $\alpha^i$ $f(\alpha^k)$ = COMPUTED VIRTUAL CHECK BYTE AT VIRTUAL CHECK LOCATION $\alpha^k$ $F_c(z)$ = VIRTUAL CHECK POLYNOMIAL = $\prod (z - \alpha^i)$
$\quad\quad\quad\quad\quad\quad\quad\quad\quad\quad\quad\quad \alpha^i \in$ VIRTUAL CHECK LOCATIONS $F_c(\alpha^i) = F_c(z)\big|_{z=\alpha^i}$ $F_c'(\alpha^k) = \dfrac{d}{dz} F_c(z)\big|_{z=\alpha^k}$

ENCODER EQUATION:

$$f(\alpha^k) = \frac{1}{F_c'(\alpha^k)} \alpha^{kL} \sum_{\substack{i \in \text{VIRTUAL} \\ \text{MESSAGE} \\ \text{LOCATIONS}}} \frac{X_i F_c(\alpha^i) \alpha^{iL}}{(\alpha^i - \alpha^k)}$$

FIG.5

$$\text{CODEWORD 1} \cdot \text{CODEWORD 2}$$

$$\begin{pmatrix} A_1 \\ A_2 \\ A_3 \end{pmatrix} \begin{pmatrix} B_1 \\ B_2 \\ B_3 \end{pmatrix} \begin{pmatrix} C_1 \\ C_2 \\ C_3 \end{pmatrix} \cdot \begin{pmatrix} a_1 \\ a_2 \\ a_3 \end{pmatrix} \begin{pmatrix} b_1 \\ b_2 \\ b_3 \end{pmatrix} \begin{pmatrix} c_1 \\ c_2 \\ c_3 \end{pmatrix} = A_1 a_1 + A_2 a_2 + A_3 a_3 + B_1 b_1 + B_2 b_2 + B_3 b_3 + C_1 c_1 + C_2 c_2 + C_3 c_3$$

FIG. 6

CODEWORD INNER PRODUCT

SOFT DECISION REED-SOLOMON DECODER

BACKGROUND OF THE INVENTION

Hard Decision Decoding

Hard decision decoding associates the analog voltages representing the bits in each byte of a received data codeword with either a binary one or a binary zero value. Only the associated binary zeroes and ones are decoded, the actual received analog voltages (which may differ slightly from zero or one) being discarded. This process virtually ignores the varying degrees of resemblance to allowed symbols among the analog versions of the received bytes. The degree of such resemblance represents information regarding the reliability of each received byte, which information is lost in the hard decision decoding process.

Soft Decision Decoding

Soft decision decoding takes into account apparent differences in reliability among the various symbols in a received codeword, and uses this reliability information to enhance the decision-making steps in the decoding process. The theoretical principles of soft decision decoding are well-known in the art, as described in Forney, G. David, Jr., "Generalized Minimum Distance Decoding", IEEE Transactions on Information Theory, Vol. IT-12, p. 125–131, April 1966, and in Error Correction Coding for Digital Communications, by Clark and Cain, p. 26–30 (Section 1.3.4, "Soft Decision Decoding") Academic Press, 1969.

First Problem

A basic problem is how to construct a high speed soft decision decoder capable of correcting large multiple burst errors in a given codeword. No practical solution to this problem appears to be known in the prior art.

Second Problem

Assuming one discovers how to construct a high speed soft decision decoder capable of handling multiple burst errors, another problem is how to use the soft decision decoder in such a manner as to actually reduce the amount of time required to correct (decode) a received codeword. Solving this latter problem would reduce the burden imposed by the necessity of additional computations involving soft decision reliability.

SUMMARY OF THE INVENTION

The "analog" form of each byte (i.e., the actual bit voltages) of a received codeword having K m-bit message byte and r m-bit check bytes is matched to the closest resembling one of the set of all binary m-bit symbols (i.e., in which all bit voltages are perfectly binary, either +1 or −1 volt) and assigned to a certain reliability reflecting the degree of resemblance. The matching process takes into account the differences between the actual bit voltages and the allowed (binary) voltages (e.g. +1 and −1 volt) and is therefore superior to a simple analog-to-digital conversion, which ignores such information. The symbols thus matched are rearranged in descending order to reliability to form a virtual codeword. The virtual codeword is then decoded using a unique algorithm which treats the first K symbols of the virtual codeword as virtual message bytes and the remaining r symbols as virtual check bytes. This produces a series of iterative approximations to the transmitted codeword. In a second matching process, the approximation most closely resembling the "analog" form of the received codeword is selected as the corrected codeword. The rearrangement of symbols to form a virtual codeword facilitates a reduction in computation time, as will be discussed below.

Solution to the First Problem

In order to determine which one of the complete set of allowed symbols most closely resembles a particular byte in the received codeword, the invention includes a processor which computes the inner product between the particular byte and each one of the complete set of allowed symbols. The processor then selects that one of the set of allowed symbols corresponding to the greatest inner product. The processor then assigns to the selected symbol a reliability measure equal to (or determined from) the magnitude of the corresponding inner product. The result is a set of selected symbols individually associated with the set of bytes in the received codeword, and a corresponding set of reliability measures. The symbols are rearranged in descending order of their reliability measures, as mentioned previously.

Because the positions of the message bytes and check bytes in the received codeword are different from those in the virtual codeword, the invention includes a virtual message Reed-Solomon re-encoder which (unlike the prior art) can operate on codewords whose bytes have been rearranged in the manner described above. The virtual message re-encoder generates a set of new virtual check bytes, which are then subtracted from the original virtual check bytes to generate a set of remainder bytes. The remainder bytes are then processed in a remainder processor using the Welch-Berlekamp algorithm.

This invention uses the interim results obtained during each recursive iteration of the Welch-Berlekamp algorithm to generate a set of interim approximations to the corrected codeword. (Previously, only the result of the final—the $r^{th}$—iteration of the Welch-Berlekamp algorithm has been used to generate one "final" corrected codeword.) The interim approximations to the corrected codeword are then compared, one at a time, with the "analog" form of the received codeword. This comparison, in one embodiment, is performed by computing the inner product between the received codeword and each of the interim approximations to the corrected codeword. The one interim approximation having the highest inner product with the received codeword is selected as the corrected codeword.

Solution to the Second Problem

The Welch-Berlekamp algorithm generates each interim approximation to the corrected codeword during each iteration of the algorithm, so that the inner product between the current iterative approximation and the received codeword may be computed while the Welch-Berlekamp algorithm computes a subsequent approximation. The number of iterations of the algorithm may be reduced by stopping execution whenever an inner product between the received codeword and the current iterative approximation is found exceeding a certain preselected threshold. Depending upon the inner product threshold selected, this event can occur when only a fraction of the usual number of iterations of the Welch-Berlekamp algorithm have been executed, thus saving a significant amount of computation time and enhancing the overall speed of the decoding process.

Synergy between the Welch-Berlekamp Algorithm and the Soft Decision Decoding of the Invention By rearranging the received codeword bytes in descending order of their respective reliabilities, the remainder bytes are computed from the most reliable codeword bytes and are automatically arranged in descending order of reliability. The Welch-Berlekamp algorithm operates on a successive individual one of the remainder bytes during each of its iterations. By thus arranging the remainder bytes in descending order of their reliabilities, the Welch-Berlekamp algorithm operates on the msot reliable remainder byte first and on the least reliable one last.

Accordingly, the earliest interim approximations generated by the Welch-Berlekamp algorithm in this invention contain the most important (i.e., the most reliable) corrections to the received codeword, while the subsequent interim approximations (generated during the later iterations of the Welch-Berlekamp algorithm) contain the lesser important (i.e., the lesser reliable) corrections to the received codeword, and these last corrections are in all likelihood smaller in magnitude. In fact it is anticipated that, in most cases, during progressive iterations of the Welch-Berlekamp algorithm the successive corrections will rapidly decrease in magnitude, perhaps reaching zero changes to the codeword after only a few iterations of the algorithm.

It is a discovery of the invention that the Welch-Berlekamp algorithm is uniquely susceptible of adaptation to soft decision decoding in a manner that reduces computation time.

DESCRIPTION OF THE DRAWINGS

The invention is best understood by reference to the accompanying drawings of which.

DETAILED DESCRIPTION

Overall System

Figure 1:
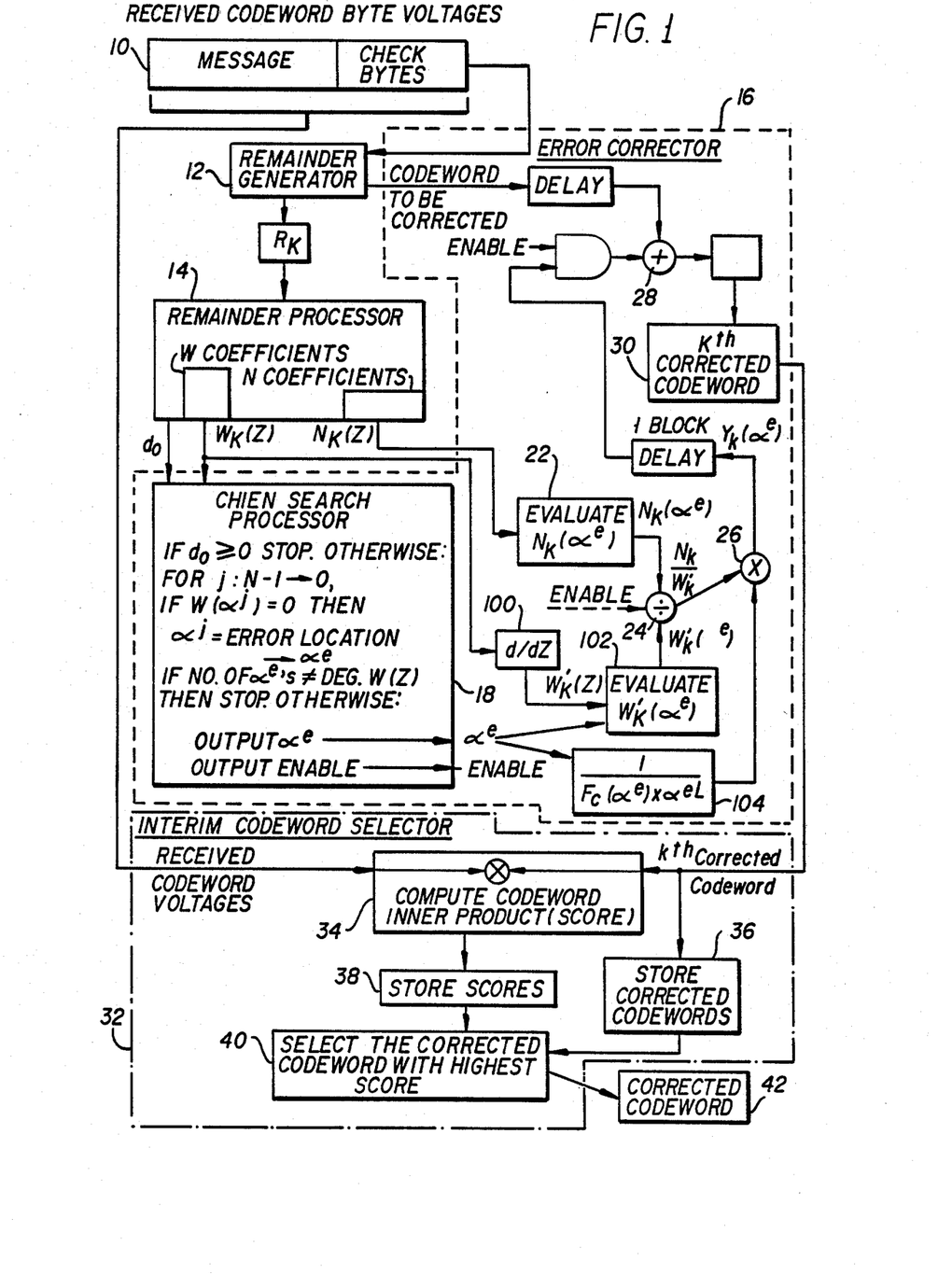
FIG. 1 is a schematic block diagram of the overall system of the invention.

Referring to FIG. 1, the system of the invention receives a codeword 10 having a number (K) of message bytes and a number (r) of check bytes, the codeword 10 comprising a total of N bytes. All the bytes have the same number (m) of bits. As received, each of the bits is really an analog voltage representing either a positive or negative binary logic state (+1 volt or −1 volt, for example). However, due to noise present in the channel over which the received codeword 10 was transmitted, the actual received voltages will not necessarily be the allowed +1 volt or −1 volt. Instead, the received voltages may differ slightly or greatly from +1 volt or −1 volt, making it difficult to determine whether a given bit corresponds to a positive or negative binary logic state. Before the codeword can be digitally processed, it must be decided whether each of the binary bits corresponds to a binary one or a binary zero.

In prior hard decision decoders, each analog voltage representing a bit in the codeword 10 was associated with either a binary one or zero depending upon how close the analog voltage resembled +1 volt or −1 volt, respectively. Once the association was made, any differences between the received analog voltage and either +1 volt or−1 volt were ignored. The purpose of the present invention is to preserve these differences as "soft" information which provides a reliability measure of each received byte. This is accomplished as follows.

Part of the function of the remainder generator 12 is to match the analog version of each m-bit byte of the received codeword 10 with the set of all binary m-bit bytes in order to select the binary m-bit byte of closest resemblance and assign a reliability equal to the degree of resemblance. The remainder generator 12 then forms a virtual codeword from the selected bytes of rearranging them in descending order of their respective reliabilities.

The remainder generator 12 then generates the remainder bytes representative of a remainder polynomial left over after division of the polynomial corresponding to the virtual codeword by a code generator polynomial. Significantly, the remainder generator 12 of the present invention generates remainder bytes in descending order of their individual reliabilities.

The invention further includes a remainder processor 14 which processes the remainder bytes in descending order of reliability using the Welch-Berlekamp algorithm (to be described below), which is the subject of U.S. Pat. No. 4,633,470 to Welch and Berlekamp. The remainder processor 14 executes the Welch-Berlekamp algorithm in a manner unique to this invention so as to produce individual candidate corrected codewords during individual iterations of the algorithm. The successive (interim) candidate corrected codeword thus generated represents succesively more accurate approximations to the correct codeword. (The algorithm requies r iterations to complete, but generates no more than r/2 candidate codewords, so that not all iterations produce a candidate codeword.)

The remainder processor 14 does not itself generate the corrected codewords but merely generates byte coefficients of an error locator polynomial, W(Z) and of an error evaluator polynomial, N(Z) at the conclusion of a given iteration of the algorithm. The corresponding candidate corrected codeword is computed from these polynomial coefficients by an error corrector 16.

The error corrector 16 includes a Chien search processor 18 which deduces, from the coefficients of W(Z), the locations of each error in the received codeword 10. The coefficients of N(Z) and of the derivative of W(Z) are processed by polynomial evaluators 20, 22 respectively whose outputs are divided in a divider 24 and scaled by a multiplier 26 to produce a correction character or byte Y for each error location found by the Chien search processor 18.

Each error correction byte Y is combined in an adder 28 with an appropriate byte in the virtual codeword (not in effect rearranged in reverse so that the byte order corresponds to that of the received codeword) to produce an interim candidate corrected codeword 30.

The interim candidate corrected codeword 30 is then compared with the received codeword 10 in an interim codeword selector 32 by an inner product multiplier 34. The inner product between the interim candidate codeword 30 and the received codeword 10 is the reliability score of the interim candidate codeword 30. All of the candidate codewords thus generated and their corresponding reliability scores are stored in memories 36, 38 respectively. In one embodiment of the invention, once all r iterations of the Welch-Berlekamp algorithm have been executed by the remainder processor 14, (so that all possible interim candidate codewords have been stored in the memory 36), that candidate codeword having the highest score (i.e., most closely resembling the received codeword) is then selected by a selector 40 as the final corrected codeword 42.

In summary, the "soft" information, comprising the differences between the analog voltages comprising the received codeword 10 and the allowed binary voltages (i.e., +1 volt or −1 volt), is not disgarded but is rather used twice. First, the soft information is used to convert the received bytes from "analog" form to binary symbols and to rearrange them in descending order of reliability. Secondly, the soft information is used in the interim codeword selector 32 in comparing each candidate corrected codeword with the actual analog voltages in the received codeword 10. As will be described below, rearranging of the codeword bytes to form the virtual codeword facilitaes a reduction in computation time.

Encoding and Transmitting

Figure 2:
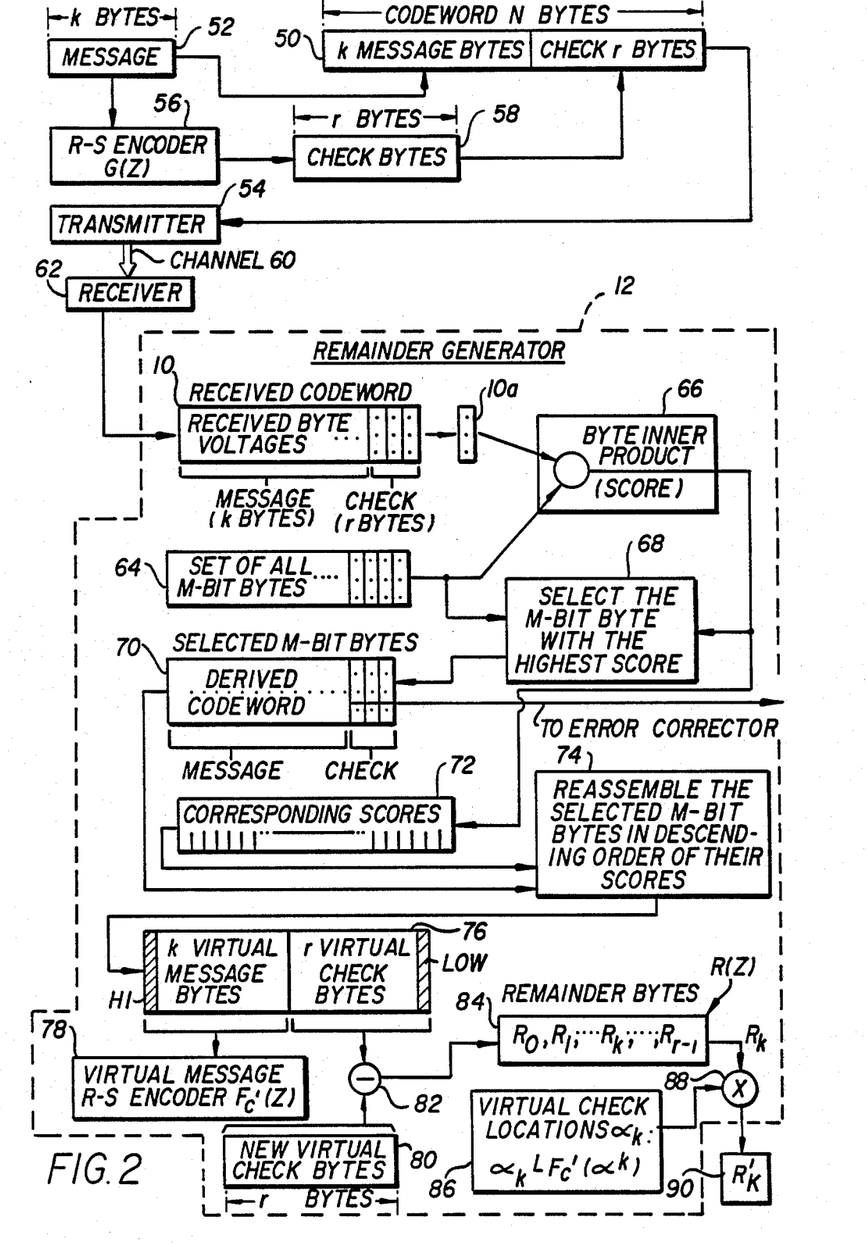
FIG. 2 is a schematic block diagram illustrating the remainder generator employed in the system of FIG. 1.

FIG. 2 illustrates the process used at the transmitting end to generate a codeword 50 from a message 52 prior to transmission by a transmitter 54. Specifically, the K m-bit bytes of the message 52 are viewed as K coefficients of a message polynomial. A Reed-Solomon encoder 56 (in effect) divides the message polynomial by a carefully selected code generator polynomial G(Z). (The code generator polynomial G(Z) is known not only by the Reed-Solomon encoder 56 on the transmitting end but also by the remainder generator 12 on the receiving end, as will be described.) The r coefficients of a remainder polynomial, left over after the polynomial division performed by the Reed-Solomon encoder 56, comprise the r check bytes 58 which are then appended to the K message bytes 52 to form the codeword 50. The transmitter 54 typically transforms the binary zeroes and ones comprising the codeword 50 into analog voltages of +1 volt and −1 volt, respectively. The codeword 50 is then transmitted by the transmitter 54 over a channel 60.

Receiving

Noise in the channel introduces errors into the codeword 50 so that it is transformed into a different ("received") codeword 10 by the time it reaches the receiver 62. (To the extent it contains correctable errors, the received codeword is not an "allowed" codeword, in that it differs from the set of codewords generated by the code generator polynomial.) Due to channel noise, the analog voltages sensed by the receiver 52 may not be precisely either +1 volt or −1 volt, but may differ significantly therefrom, so that it may be hard to tell exactly whether each bit in the received codeword 10 is a binary 1 or a binary 0 and, as such, whether it is correct or represents an error.

Remainder Generator

The remainder generator 12 computes the inner product between each byte 10a of the received codeword 10 and each one of the complete set of all binary m-bit bytes (stored in a register 64) in order to find the one of closest resemblance to the received byte. The m-bit bytes held in register 64 comprise all possible m-bit bytes having bits which are either +1 or −1 (corresponding to the two "binary" analog voltages). In contrast, the received codeword byte 10a has m bits comprised of analog voltages which may be any value (not necessarily +1 or −1 volt), depending upon the channel noise.

Euclidian Inner Product

Figure 3A:
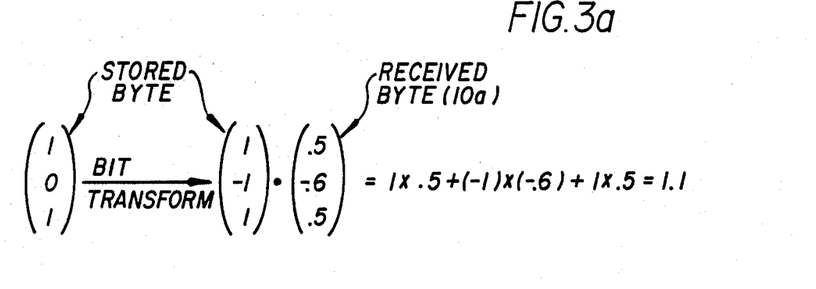
FIGS. 3a, 3b and 3c illustrate the process used in the invention for computing an inner product between two byte symbols.
Figure 3B:
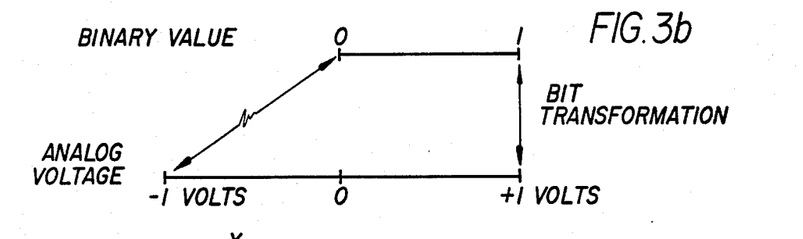
Figure 3C:
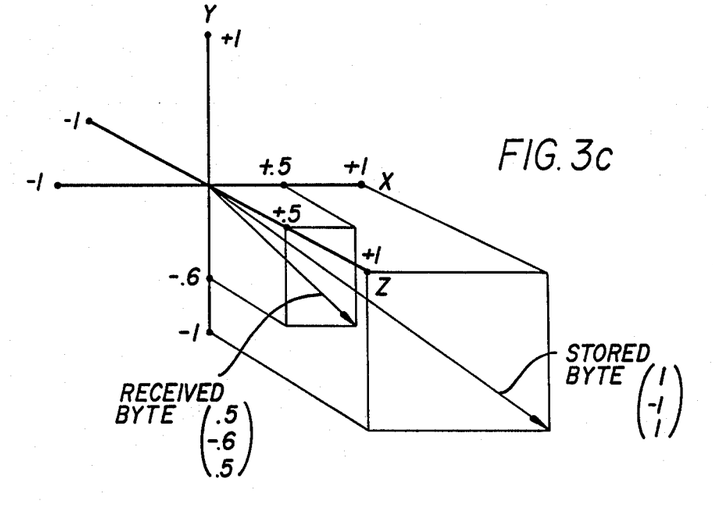

Each inner product between the received codeword byte 10a and each of the complete set of m-bit bytes stored in the register 64 is computed by a multiplier 66, in accordance with the principles illustrated in FIGS. 3a, 3b and 3c. FIGS. 3a, 3b and 3c illustrate a very simple example in which m=3 so that each byte has three bits. In FIG. 3a, a three-bit binary byte (stored in the register 64) is transformed from the usual form (in which bits are either one or zero) to the analog form corresponding to that used by the transmitter 54 (in which each bit is either +1 volt or −1 volt) in accordance with the transformation map illustrated in FIG. 3b.

The transformed byte is then multiplied by the received byte 10a (which is also a three-bit byte in this simple example). As illustrated in FIG. 3a, the numerical products of corresponding bits of the two three-bit bytes are computed and the resulting three products are added together to form a single or scalar number comprising the inner product. FIG. 3c illustrates two vectors in three-dimensional Euclidian space corresponding to the two three-bit bytes of FIG. 3a. The inner product computed in FIG. 3a is simply the inner product between the two vectors of FIG. 3c.

A processor 68 selects that binary m-bit byte from the register 64 having the greatest inner product with the received codeword byte 10a. The byte thus selected is then stored in a registor 70 in a location corresponding to that of the received byte 10a in the received codeword 10. At the same time, the processor 68 stores the corresponding inner product in a similar location in a register 72. The inner products stored in the register 72 are the reliability values of the corresponding selected bytes stored in the register 70.

A processor 74 changes the order of the selected bytes from that in which they are stored in the register 70 to one in which the bytes are stored in descending order of their reliability values. The processor 74 simply inspects all of the values in the register 72, fetches the bytes one at a time from the register 70 and stores them in descending order of their reliability values in a virtual codeword register 76.

It will be recalled that the original codeword 50 had K message bytes and r check bytes. In the virtual codeword now stored in the register 76, the first K bytes (which are the bytes with the highest reliability score) are K virtual message bytes, while the remaining r bytes (the bytes having the lowest reliability scores) are r virtual check bytes.

A set of remainder bytes is now computed from the virtual codeword stored in the register 76 by a virtual message encoder 78. The encoder 78 encodes the K virtual message bytes to generate a set of r new virtual check bytes, which it stores in a register 80. The r new virtual check bytes are subtracted from the r original virtual check bytes by a subtractor 82, the result being r remainder bytes which are stored in a register 84. The remainder bytes are denoted individually by $R_k$, where k ranges from r-1 to 0. Each of the remainder bytes is multiplied by a scale factor stored in a memory 86 (the scale factor being defined in FIG. 2) by a multiplier 88, to generate a set of r scaled remainder coefficients $R'_k$.

Virtual Message Encoder

As noted above, the virtual message encoder 78 of FIG. 2 encodes the K message bytes of the virtual codeword to generate r new virtual check bytes. The difficulty is that the virtual message bytes necessarily comprise some of the original message and/or check bytes whose order has been randomly permuted in accordance with the reliability values computed by the multiplier 66. Accordingly, a simple Reed-Solomon encoder cannot be used for this task. Instead, the virtual message Reed-Solomon encoder defined in FIG. 4 must be used. The K virtual message bytes are used to generate r virtual check bytes in accordance with an encoder equation shown in FIG. 4. In this equation, $\alpha^k$ is an element (byte) of the Galois Field $GF(2^m)$ and also is a location symbol designating the $k^{th}$ location in the codeword. The virtual check byte in the $k^{th}$ virtual check location, denoted $f(\alpha^k)$, is a function of: (1) all of the received virtual message bytes $X_i$, (2) the virtual check polynomial $F_c(Z)$ evaluated at each of location symbols $\alpha^l$ designating a virtual message location and (3) the derivative of the virtual check polynomial, $F_c'(Z)$ evaluated at each of the location symbols $\alpha^k$ designating a virtual check location.

Virtual Check Polynomial $F_c(z)$

Figure 4:
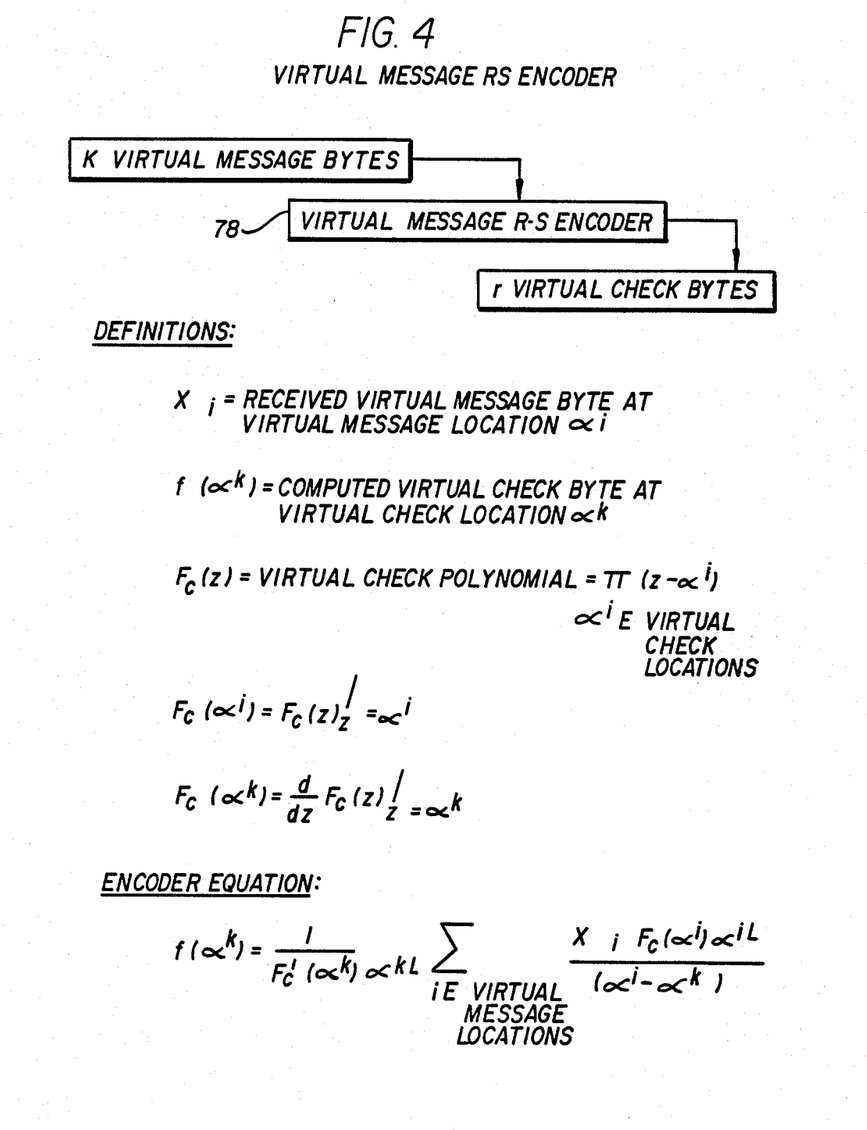
FIG. 4 is a block diagram defining the virtual message re-encoder included in the remainder generator of FIG. 2.

As mentioned above, each of the N byte locations is a codeword is uniquely designated by an indivdual element $\alpha^k$ of the Galois Field $GF(2^m)$. The $k^{th}$ location may be designated by $\alpha^k$, for example. (The role of such location characters is described in U.S. patent application Ser. No. 076,579 entitled "Hard-Wired Serial Galois Field Decoder" filed July 22, 1987 to Earl T. Cohen.) The reassembly processor 74, in rearranging the codeword byte locations to generate the virtual codeword, necessarily causes a corresponding change in the order of the location characters $\alpha^k$, so that their order associated with the virtual codeword is different from that associated with the original codeword. The reassembly processor stores the "rearranged" order of the location characters. The virtual check polynomial, $F_c(z)$, as defined in FIG. 4, is the polynomial whose roots are each of the virtual check location characters, i.e., the location characters $\alpha^k$ associated with the last r bytes of the virtual (rearranged) codeword. The virtual message encoder 78 obtains the virtual check location characters from the reassembly processor 74.

Remainder Processor

If there are no errors in the virtual codeword stored in the register 76, then the remainder stored in the register 84 is zero. Otherwise, the remainder is non-zero and it must be processed in order to perform error correction.

The Welch-Berlekamp algorithm performed by the remainder processor 14 is described generally in the Welch-Berlekamp patent referenced above (U.S. Pat. No. 4,633,470). A hard-wired version of the remainder processor 14 which executes a version of the Welch-Berlekamp algorithm is described in detail in the above-referenced application by Cohen, and therefore need not be described in detail herein.

Generally, the Welch-Berlekamp algorithm requires execution of r iterations of the algorithm, in which the result of each iteration are used during the next. Such results are successive (interim) approximations to the coefficients of an error locator polynomial and an error evaluator polynomial. After r iterations, the final approximation to the coefficients of an error location polynomial W(Z) and an error evaluation polynomial N(Z) have been computed and are made available for use in error correction.

Modified Welch-Berlekamp Algorithm

Figure 5:
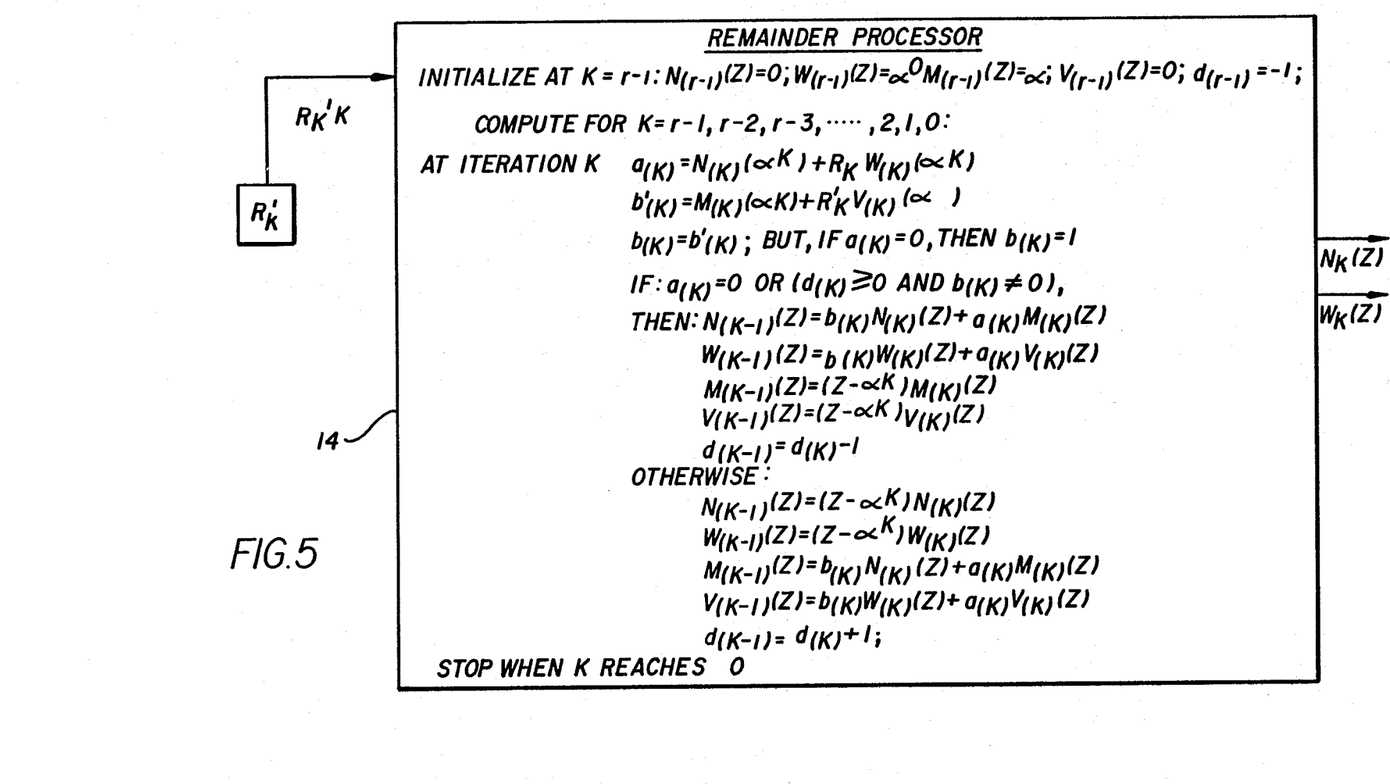
FIG. 5 is a block diagram illustrating the operation of the remainder processor of the system of FIG. 1.

In accordance with the present invention, and in order to take advantage of the special characteristics of the Welch-Berlekamp algorithm, the version of the Welch-Berlekamp algorithm executed by the remainder processor 14 (illustrated in FIG. 5) is a modification of that described in the above-referenced Cohen patent application. In this modification, the interim version of the coefficients of the error location and error evaluation polynomials, $N_k(Z)$ and $W_k(Z)$, computed during each ($k^{th}$) iteration, is output by the processor 14, as well as being saved and used during the next ($k+1^{st}$) iteration. This interim version of the polynomial coefficients is used to make an interim correction to the codeword so as to construct an interim candidate corrected codeword.

Error Corrector 16

The "error" location character $\alpha^e$ is one of the N codeword location characters $\alpha^k$ discussed previously herein and designates a codeword byte location containing an error. As many as r/2 different error locations may be found in a given codeword by the Chien search processor 18 simply by searching for the roots of $W_k(Z)$. Each such root is an error location, i.e., a particular one, $\alpha^e$, of the set of the location characters $\alpha^k$. FIG. 1 illustrates the operation of the Chien search processor 18 in block form, and its operation is described more particularly in the U.S. patent application by Earl T. Cohen referenced above, and need not be described further herein.

Referring to FIG. 1, following the $k^{th}$ iteration of the algorithm, the $k^{th}$ error location polynomial $W_k(Z)$ is differentiated by a differentiator 100, and the result, $W_k'(Z)$ is evaluated in a polynomial evaluator 102 by setting Z equal to a respective one of the error location characters $\alpha^e$ found by the Chien search processor 18. Simultaneously, the corresponding error evaluator polynomial $N_k(Z)$ is evaluated by the polynomial evaluator 22 at the same error location character, $\alpha^e$, and the outputs of the two evaluators 20, 22 are fed to a divider 24 to generate a quotient. As many as r/2 such quotients may have to be generated in this manner to correct all of the errors in the codeword identified by the Chien search processor 18.

Each quotient is multiplied by a multiplier 26 with a scale factor stored in a memory 104, the scale factor being a function of the corresponding error location character $\alpha^e$. The definition of $F_c(\alpha^e)$ in the scale factor defined in FIG. 1 is similar to that of the check polynomial $F_c(\alpha^i)$ given in FIG. 4. The quantity L in the definition in FIG. 1 is the order of $GF(2^m)$ of the location character $\alpha^L$ of the first byte in the received codeword, as described in the Cohen patent application referenced above.

The output of the multiplier 26 is the error value byte, namely $Y_k(\alpha^e)$ and is added by an adder 28 to the byte in the location corresponding to the $\alpha^e$ in the codeword stored in the register 70 in FIG. 1. During the $k^{th}$ iteration, as many as r/2 error locations, $\alpha^e$, may be identified by the Chien search processor, as mentioned previously herein. Therefore, as many as r/2 corresponding error evaluation bytes, $Y_k(\alpha^e)$, are added to corresponding locations in the codeword to generate the $k^{th}$ interim candidate corrected codeword 30. No more than r/2 interim candidated corrected codewords are generated during the r iterations of the Welch-Berlekamp algorithm.

Interim Codeword Selector

Figure 6:
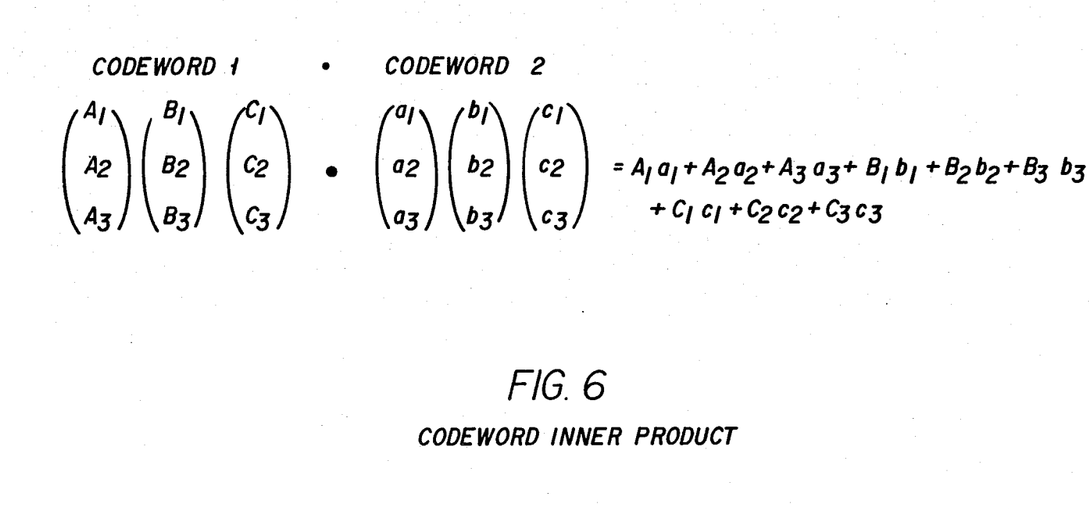
FIG. 6 is an exemplary diagram illustrating the computation performed by the interim codeword selector of the system of FIG. 1 of the inner product between two codewords, in this example two three-byte, three-bit-per-byte codewords.

As described previously, the interim codeword selector 32 computes the inner product between the analog version of the received codeword 10 and each of the candidate corrected codewords 30 to compute a set of scores from which the most reliable one of the interim corrected codewords may be selected. FIG. 6 illustrates the algorithm by which the inner product between two three-byte, three-bit-per-byte codewords may be computed. Referring to the byte inner product definition illustrated in FIG. 3a, the codeword inner product is simply the sum of the byte inner products computed between corresponding bytes of the two codewords. The resulting codeword inner product is taken (in this embodiment) as the reliability score of the corresponding interim candidate corrected codeword. The most reliable one may be selected by simply choosing the candidate codeword having the highest score.

Reducing Computation Time

It is anticipated in most cases that the interim corrections generated during the early (first several) iterations of the Welch-Berlekamp algorithm will rapidly approach complete correction, so that interim corrections generated during subsequent iterations will be negligible. This is a consequence of the rearrangement of the codeword bytes in descending order of reliability, as discussed previously. Therefore, significant computation time may be saved by halting execution of the algorithm and selecting the latest candidate codeword whenever the reliability score exceeds a predetermined threshold or, alternatively, after execution of a predetermined number of algorithm iterations less than r.

Computing the Reliability Score

As previously described in connection with FIG. 2, each individual byte 10a in the received codeword 10 is matched to one of the set of all allowed bytes, the match being defined by means of an inner product. Furthermore, as previously described, the reliability of the selected byte is taken to be the magnitude of the inner product between the selected byte and the received codeword byte. Likewise, the reliability score of each candidate codeword stored in the memory 36 is also taken to be the inner product between that codeword and the "analog" form of the received codeword 10.

However, there are other methods for computing reliability or reliability scores. For example, in the case of the codeword bytes selected from the register 64, one may compute the probability that the selected byte was the byte originally transmitted by the transmitter 64 based upon the nature of the noise in the channel 60. However, the manner in which the reliabilities of the various selected bytes and the reliability scores of the various candidate codewords are computed is immaterial to the invention. In fact, the simple (preferred) inner product method for directly computing reliability or reliability scores is perfectly valid and serves as but one example by which the invention may be implemented.

Accordingly, while the invention has been described in detail with particular reference to preferred embodiments thereof, other variations and modifications may be made without departing from the spirit and scope of the invention.

What is claimed is:

1. A Reed-Solomon soft decision decoder, comprising:
   remainder generator means for generating a set of remainder coefficients from a received codeword;
   remainder processor means for processing said remainder coefficients by executing one or more iterations of a recursive algorithm, whereby to generate one set of error descriptive coefficients upon each execution of one of said iterations; and
   means for computing a candidate corrected codeword from each set of said error descriptive coefficients whereby to produce a plurality of candidate codewords
   wherein said remainder generator means comprises:
   means for receiving an analog N-byte m-bit-per-byte codeword in the form of a plurality of analog voltages representing a corresponding plurality of bits comprised within each byte of said analog codeword, said analog voltages not necessarily being restricted to a binary set of voltages;
   means for determining the resemblance of each of the N-bytes of said analog codeword to each of a set of binary m-bit bytes, and, for each of said N-bytes of said analog codeword, selecting said one of the set of binary bytes having the greatest resemblance thereto;
   means for forming a virtual codeword from the set of said binary bytes selected by said determining means, by rearranging said selected binary bytes in descending order of their resemblances; and
   means for computing said set of remainder coefficients from said virtual codeword.

2. The decoder of claim 1 wherein each successive iteration of said algorithm processes a successive one of said remainder coefficients and the error descriptive coefficients generated during the previous one of said iterations.

3. The decoder of claim 2 wherein said algorithm comprises the Welch-Berlekamp algorithm.

4. The decoder of claim 1 wherein said resemblance between said candidate corrected codeword and said received codeword comprises the sum of the Euclidian inner products between corresponding bytes of said codewords.

5. The decoder of claim 1 wherein the resemblance between each of the N bytes of said analog codeword and one of the set of corrected bytes is the Euclidian inner product between them.

6. The decoder of claim 1, wherein said means for computing said set of remainder coefficients from said virtual codeword comprise:
   a virtual Reed-Solomon encoder adapted to compute a set of r virtual check bytes from the first K bytes of said virtual codeword having the K greatest resemblances;

means for subtracting said virtual check bytes from the last r bytes of said virtual codeword having the r smallest resemblances, whereby the resulting byte differences comprise the remainder coefficients.

7. The decoder of claim 6 wherein said virtual Reed-Solomon encoder comprises:

means for forming a check location polynomial whose roots are the location characters of the r last bytes in said virtual codeword;

means for multiplying each of the first K bytes in said virtual codeword by said check polynomial evaluated at the location character of the corresponding one of said first K bytes of said virtual codeword, and dividing by the difference between said location character and the location character of the $k^{th}$ one of said last r bytes of said virtual codeword; and means for computing the sum of each product computed by said multiplier means and dividing said sum by the derivative of said check polynomial evaluated at the location character of said $k^{th}$ one of the last r bytes in said virtual codeword, whereby the quotient thus obtained is the $k^{th}$ new virtual check byte at least to within a scale factor.

8. In a Reed-Solomon decoder which generates plural sets of error correction coefficients during corresponding plural iterations of a recursive algorithm so as to process in each iteration a successive one of a set of remainder coefficients and the set of error descriptive coefficients generated during the previous iteration, a remainder generator which generates said set of remainder coefficients, said remainder generator comprising:

means for receiving a plurality of analog voltages representing a corresponding plurality of individual bits of a received N-byte m-bit-per-byte codeword;

means for generating or storing all binary m-bit bytes;

means for computing the inner product between each of said bytes of said received codeword in each of said binary bytes, and for selecting therefrom N correct bytes having the greatest inner products with corresponding ones of said bytes of said received codeword;

means for rearranging said bytes selected by said computing means in descending order of their inner products to form a virtual codeword;

virtual encoder means for computing a set of r virtual check bytes from the first k bytes of said virtual codeword having the k highest inner products; and means for subtracting said virtual check bytes from the last r bytes of said virtual codeword having the r smallest inner products, whereby the difference computed by the subtraction comprises said remainder coefficients.

9. The Reed-Solomon decoder of claim 8 wherein said virtual encoder means comprise:

means for forming a check location polynomial whose roots are the location characters of the r last bytes in said virtual codeword;

means for multiplying each of the first K bytes in said virtual codeword by said check polynomial evaluated at the location character of the corresponding one of said first K bytes of said virtual codeword, and dividing by the difference between said location character and the location character of the $k^{th}$ one of said last r bytes of said virtual codeword; and means for computing the sum of each product computed by said multiplier means and dividing said sum by the derivative of said check polynomial evaluated at the location character of said $k^{th}$ one of the last r bytes in said virtual codeword, whereby the quotient thus obtained is the $k^{th}$ new virtual check byte to within a scale factor.

10. The decoder of claim 8 wherein each said inner product comprises a vector inner product multiplication of Euclidian space comprising m-dimensional vectors representing each of said bytes.

11. A method for performing soft decision decoding, comprising:

choosing N binary m-bit bytes from a set of m-bit binary bytes, each of the N binary bytes being that one of said set of all m-bit binary bytes which has the greatest resemblance to a corresponding byte in a received codeword;

reordering said N binary bytes in descending order of their individual resemblances to the corresponding received codeword bytes, so as to form a virtual codeword;

computing a set of virtual remainder coefficients from said virtual codeword;

executing at least one iteration of a recursive algorithm so as to process a successive one of said virtual remainder coefficients and any error descriptive coefficients computed during any previous iteration thereof, whereby to generate a corresponding new set of error descriptive coefficients, wherein a plurality of such iterations of said recursive algorithm generates a corresponding plurality of sets of said error descriptive coefficients;

computing a candidate corrected codeword for each of said set of error descriptive coefficients; and choosing that candidate codeword most closely resembling said received codeword.

12. The soft decision decoding method of claim 11 further comprising detecting whenever a candidate codeword is found having at least a predetermined threshold resemblance to said received codeword and halting the execution of said algorithm in response thereto while choosing the corresponding candidate corrected codeword as the corrected codeword.

13. The soft decision decoding method of claim 11 wherein said step for computing a set of remainder coefficients from said virtual codeword comprises:

computing a set of new r virtual check bytes from the first K bytes of said virtual codeword having the K greatest resemblances; and subtracting said new r virtual check bytes from the last r bytes of said virtual codeword having the r smallest resemblances, whereby the resulting byte differences comprise said virtual remainder coefficients.

14. The soft decision decoding method of claim 13 wherein said step for computing a set of new r virtual check bytes comprises:

forming a virtual check location polynomial whose roots are location characters of the last r bytes in said virtual codeword;

multiplying each of the first K bytes in said virtual codeword by said check polynomial evaluated at the location character of the corresponding one of said first K bytes of said virtual codeword and dividing the result thereof by the difference between said location character and the location character of the $k^{th}$ one of the last r bytes in said virtual codeword; and computing the sum of each product computed by said multiplying means and dividing said sum by the derivative of said check polynomial evaluated at the location character of said $k^{th}$ one of said last r bytes in said virtual codeword, whereby the quotient thus obtained is the $k^{th}$ virtual check byte at least to within a scale factor.

* * * * *